(12) United States Patent
Iizuka et al.

(10) Patent No.: US 7,979,755 B2
(45) Date of Patent: Jul. 12, 2011

(54) SEMICONDUCTOR INTEGRATED CIRCUIT DEVICE FOR DISPLAY CONTROLLER

(75) Inventors: Masaru Iizuka, Tokyo (JP); Sosuke Tsuji, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 542 days.

(21) Appl. No.: 11/869,976

(22) Filed: Oct. 10, 2007

(65) Prior Publication Data
US 2008/0104457 A1 May 1, 2008

(30) Foreign Application Priority Data

Oct. 30, 2006 (JP) ................................. 2006-293766

(51) Int. Cl.
*G11C 29/00* (2006.01)
*G09G 5/39* (2006.01)
*G06F 12/02* (2006.01)

(52) U.S. Cl. ........ 714/710; 714/711; 714/718; 345/531; 345/566

(58) Field of Classification Search .................. 714/710, 714/711, 718; 345/531, 566
See application file for complete search history.

(56) References Cited

U.S. PATENT DOCUMENTS

| 5,383,162 | A | * | 1/1995 | Shirai et al. | 365/185.09 |
| 5,485,424 | A | * | 1/1996 | Kawamura | 365/200 |
| 5,691,952 | A | * | 11/1997 | Sasaki et al. | 365/230.08 |
| 5,696,723 | A | * | 12/1997 | Tukahara | 365/200 |
| 5,963,488 | A | * | 10/1999 | Inoue | 365/200 |
| 6,085,288 | A | * | 7/2000 | Arimilli et al. | 711/118 |
| 6,157,584 | A | * | 12/2000 | Holst | 365/200 |
| 6,202,180 | B1 | * | 3/2001 | Nose | 714/718 |
| 6,513,130 | B1 | * | 1/2003 | Cross | 714/6 |
| 6,567,323 | B2 | * | 5/2003 | Pitts et al. | 365/200 |
| 6,850,435 | B2 | * | 2/2005 | Tanaka | 365/185.08 |
| 6,966,012 | B1 | * | 11/2005 | Gandhi | 714/7 |
| 6,991,947 | B1 | * | 1/2006 | Gheewala | 438/15 |
| 7,336,535 | B2 | * | 2/2008 | Kuroda et al. | 365/185.08 |
| 7,492,643 | B2 | * | 2/2009 | Takeuchi | 365/185.28 |
| 2003/0043648 | A1 | * | 3/2003 | Tsuji | 365/200 |
| 2008/0266965 | A1 | * | 10/2008 | Takeuchi et al. | 365/185.17 |
| 2009/0323416 | A1 | * | 12/2009 | Takeuchi et al. | 365/185.03 |

FOREIGN PATENT DOCUMENTS

JP 2000-347646 A 12/2000

OTHER PUBLICATIONS

Chinese Office Action dated Dec. 31, 2010 issued in Chinese Application No. 200710167577.1.

* cited by examiner

*Primary Examiner* — John J Tabone, Jr.
(74) *Attorney, Agent, or Firm* — Miles & Stockbridge P.C.

(57) ABSTRACT

The present invention is directed to repair a defective bit included in a memory in a semiconductor integrated circuit device for a display controller. The semiconductor integrated circuit device has a display memory capable of storing display data in a storage area, and a repair circuit capable of repairing a defect by replacing an area including a defect in the display memory with a spare storage area provided on the outside of a regular storage area for storing the display data. The device further includes a selector circuit provided on a transmission path of output data from the display memory and selectively replacing output data from the regular storage area with output data from the spare storage area in accordance with a control signal from the repair circuit. By selectively replacing the output data from the regular storage area with output data from the spare storage area in accordance with a control signal from the repair circuit, a defective bit is repaired.

4 Claims, 15 Drawing Sheets

FIG. 7

TIME-DIVISION TRANSFER →

| | TRANSFER ADDRESS | | |
|---|---|---|---|
| | ADD0 | ADD1 | ADD2 |
| FOR LEFT MAT LOGIC CIRCUIT 214L | add0 | add1 | add3 |
| FOR LEFT MAT CLOCKED INVERTER CIRCUIT 312L (FOR REPAIRING add2) | ADD3 | ADD4 | ADD5 |
| FOR RIGHT MAT LOGIC CIRCUIT 214R | add0 | add3 | add2 |
| FOR RIGHT MAT CLOCKED INVERTER CIRCUIT 312R (FOR REPAIRING add1) | | | |

FIG. 8

| ADDRESS BITS | add0 | add1 | add2 | add3 | add0 | add1 | add2 | add3 |
|---|---|---|---|---|---|---|---|---|
| A2 | 0 | 0 | 0 | ✕ | 0 | 1 | 1 | ✕ |
| A1 | 0 | 0 | 1 | 1 | 1 | 0 | 0 | 1 |
| A0 | 0 | 1 | 0 | 1 | 1 | 0 | 1 | 0 |

FIG. 10

| | TRANSFER ADDRESS | | | | | |
|---|---|---|---|---|---|---|
| | ADD0 | ADD1 | ADD2 | ADD3 | ADD4 | ADD5 |
| FOR LOGIC CIRCUITS 214R AND 214L | add0 | add1 | add2 | add7 | add6 | add5 |
| FOR CLOCKED INVERTER CIRCUITS 312R AND 312L (FOR REPAIRING add3 AND add4) | | | | | | |

FIG. 11

| ADDRESS BITS | ADD0 | ADD2 | ADD4 | ADD6 | ADD1 | ADD3 | ADD5 | ADD7 |
|---|---|---|---|---|---|---|---|---|
| | add0 | add2 | add4 | add6 | add1 | add3 | add5 | add7 |
| A2 | 0 | 0 | 1 | 1 | 0 | 0 | 1 | 1 |
| A1 | 0 | 1 | 0 | 1 | 0 | 1 | 0 | 1 |
| A0 | 0 | 0 | 0 | 0 | 1 | 1 | 1 | 0 |

SEMICONDUCTOR INTEGRATED CIRCUIT DEVICE FOR DISPLAY CONTROLLER

CROSS-REFERENCE TO RELATED APPLICATIONS

The disclosure of Japanese Patent Application No. 2006-293766 filed on Oct. 30, 2006 including the specification, drawings and abstract is incorporated herein by reference in its entirety.

BACKGROUND OF THE INVENTION

The present invention relates to a semiconductor integrated circuit device for a display controller, having therein a RAM (Random Access Memory) for storing display data and controlling a display device, and relates to a technique effectively used for, for example, a liquid crystal display controller driver for driving a liquid crystal display panel.

In recent years, as a display device of a portable electronic device such as a cellular phone or a PDA (Personal Digital Assistant), generally, a dot-matrix-type liquid crystal panel in which a plurality of display pixels are arranged two-dimensionally in a matrix is used. The device has therein a liquid crystal display (LCD) controller (liquid crystal controller) formed as a semiconductor integrated circuit for performing a display control of the liquid crystal panel and a liquid crystal driver for driving the liquid crystal panel under control of the controller, or a liquid crystal display controller driver (liquid crystal controller driver) having therein the liquid crystal controller and the liquid crystal driver.

Hitherto, a liquid crystal display controller driver (including the liquid crystal controller) has therein a RAM for storing display data in a chip. The storage capacity of the built-in RAM is generally determined according to the size of a display screen of the liquid crystal panel to be driven. As compared with a general memory, the storage capacity of the RAM is smaller, and a so-called redundancy circuit for repairing a defective bit is not provided.

The storage capacity of the built-in RAM is specified to the size of the screen of the liquid crystal panel for the following reason. In the liquid crystal controller driver, even when the capacity of the built-in RAM is set to the size of storing display data of one screen of the liquid crystal panel, since the proportion of the RAM occupying the chip area is relatively large, increase in the storage capacity directly results in increase in the chip cost. With respect to a built-in RAM having the capacity of storing display data of one screen, decrease in the yield due to a defect in the RAM is not a big issue, so that there is little necessity to provide a redundancy circuit. Increase in the chip size by providing a redundancy circuit can be avoided.

For example, Japanese Unexamined Patent Publication No. 2000-347646 discloses that the storage capacity of a built-in RAM in a liquid crystal controller driver is set to the size of storing display data of one screen of a liquid crystal panel.

SUMMARY OF THE INVENTION

The inventors of the present invention employed the microfabrication process to increase the density of a built-in RAM in order to decrease the chip size of the liquid crystal controller driver and the chip cost. However, it is understood that when the density of the built-in RAM is increased, occurrence of a defect increases, and deterioration in the yield caused by a defect in the RAM becomes an issue.

The inventors of the present invention have examined improvement in the yield by applying a memory defect repairing technique using a redundancy circuit employed in a general RAM. However, in a redundancy circuit employed in a general RAM, a control circuit for selecting a regular memory row or column and a control circuit for selecting a spare row or column (redundancy memory) to be replaced with a defective bit are provided separately. Consequently, the operation characteristic such as reading speed varies between an access to a regular memory row or column and an access to a spare memory row or column, so that designing of timings of peripheral circuits of the memory is difficult. In the memory defect repairing technique employed by the general RAM, in addition to a circuit (hereinbelow, called a fuse circuit) having a programmable element such as a fuse and storing the address of a row or column to be repaired, a fuse circuit for storing whether repair is performed or not, that is, a spare storage area is used or not is necessary. On the basis of the state of the fuse circuit, a control signal for making a spare row or column valid or invalid is generated and supplied. Further, in the case where a redundancy circuit of a general RAM is provided with a plurality of spare rows or columns, a selection signal for designating a row or column to be used has to be supplied. Consequently, when the memory defect repairing technique of a general RAM is applied as it is to a liquid crystal controller driver, the occupation area of the redundancy circuit and wires becomes large and it may disturb reduction in the chip size.

In the case of the liquid crystal controller driver, at the time of reading display data from a memory array and outputting it to the circuit at the post stage, repair on the word line unit basis does not have to correspond to the display position in the liquid crystal display device, but it is sufficient to change an address to be selected. However, to repair a data line, the position of data has to be replaced so as to correspond to the display position in the display device. Consequently, the memory defect repairing technique for a general RAM cannot be applied as it is to the liquid crystal controller driver.

An object of the present invention is to provide a technique for repairing a defective bit included in a memory in a semiconductor integrated circuit device for a display controller, such as a liquid crystal controller driver having therein a memory for storing display data.

The above and other objects of the present invention and novel features will become apparent from the description of the specification and the appended drawings.

Outline of representative ones of inventions disclosed in the present invention will be briefly described as follows.

In a semiconductor integrated circuit device for a display controller, such as a liquid crystal controller driver having therein a RAM for storing display data, a defective bit included in the memory can be repaired.

Effects obtained by representative ones of the inventions disclosed in the specification will be briefly described as follows.

The present invention provides a semiconductor integrated circuit device for a display controller, including: a display memory having a storage area and capable of storing display data for a display device into the storage area; a spare storage area provided on the outside of a regular storage area for storing the display data; a repair circuit capable of repairing a defect by replacing an area including a defect in the display memory with the spare storage area; and a selector circuit provided in a transmission path of output data from the display memory and for selectively replacing output data from the regular storage area with output data from the spare storage area in accordance with a control signal from the repair circuit.

With the means, the selector circuit is provided in a transmission path of output data from the display memory and selectively replacing output data from the regular storage area with output data from the spare storage area in accordance with a control signal from the repair circuit. Thus, it achieves the object of the present invention of repairing a defective bit included in a memory in a semiconductor integrated circuit device for a display controller, such as a liquid crystal controller driver having therein a memory for storing display data.

The present invention also provides a semiconductor integrated circuit device for a display controller, including: a display memory having a storage area and capable of storing display data for a display device into the storage area; a spare storage area provided on the outside of a regular storage area for storing the display data; a repair circuit capable of repairing a defect by replacing an area including a defect in the display memory with the spare storage area; a data bus for transmitting output data from the display memory to a circuit at a post stage; a plurality of tri-state circuits provided in correspondence with data output terminals of the display memory and capable of supplying output data from the data output terminals of the display memory to the data bus; a logic circuit for receiving data transmitted from the display memory via the data bus; and a control circuit for making the plurality of tri-state circuits shift to a data output state in a time division manner. The repair circuit makes the tri-state circuit corresponding to the spare storage area shift to a data output state in place of the tri-state circuit corresponding to the area including the defect in the display memory.

With the means, the control circuit sequentially makes the plurality of tri-state circuits shift to a data output state in a time division manner. In this case, the repair circuit makes the tri-state circuit corresponding to the spare storage area shift to a data output state in place of the tri-state circuit corresponding to the area including the defect in the display memory. Thus, it achieves the object of the present invention of repairing a defective bit included in a memory in a semiconductor integrated circuit device for a display controller, such as a liquid crystal controller driver having therein a memory for storing display data.

When a positive integer excluding 0 is set as "n", an un-used address is assured by dividing the display memory into a plurality of storage areas each smaller than an address space of the n-th power of 2, and the un-used address is assigned to the tri-state circuit corresponding to the spare storage area, thereby performing address control for making the tri-state circuit corresponding to the spare storage area shift to a data output state in place of the tri-state circuit corresponding to the area including the defect in the display memory.

The data bus may be shared by a plurality of mats formed by dividing the display memory into storage areas each smaller than an address space of the n-th power of 2.

The data bus includes a first data bus to which output terminals of the tri-state circuits are coupled and a second data bus to which an input terminal of the logic circuit is coupled, and the first and second data buses may transmit/receive data to/from each other via a logic circuit capable of performing a predetermined logic operation on input data.

The semiconductor integrated circuit device may further include an internal address conversion circuit capable of converting an address signal supplied from the outside into an internal address signal and a mat selection signal. A mat is selected by the mat selection signal, and address control for making the tri-state circuit corresponding to the spare storage area shift to a data output state may be performed by using the internal address signal.

The present invention also provides a semiconductor integrated circuit device for a display controller, including: a display memory having a storage area and capable of storing display data for a display device into the storage area; a spare storage area provided on the outside of a regular storage area for storing the display data; a repair circuit capable of repairing a defect by replacing an area including a defect in the display memory with the spare storage area; a data bus for transmitting output data from the display memory to a circuit at a post stage; a plurality of tri-state circuits provided in correspondence with data output terminals of the display memory and capable of supplying output data from the data output terminals of the display memory to the data bus; a logic circuit for receiving data transmitted from the display memory via the data bus; and an address shifter disposed for a data transmission path between the plurality of tri-state circuits and the logic circuit and shifting an address for selecting the tri-state circuit in accordance with repair information, thereby making the tri-state circuit corresponding to the spare storage area shift to a data output state in place of the tri-state circuit corresponding to an area including a defect in the display memory.

With the means, the address shifter shifts an address for selecting the tri-state circuit in accordance with repair information, thereby making the tri-state circuit corresponding to the spare storage area shift to a data output state in place of the tri-state circuit corresponding to an area including a defect in the display memory. Thus, it achieves the object of the present invention of repairing a defective bit included in a memory in a semiconductor integrated circuit device for a display controller, such as a liquid crystal controller driver having therein a memory for storing display data.

The selector may be disposed so as to be able to shift data on the transmission path to an adjacent data transmission path.

As the tri-state circuit, a clocked inverter can be applied.

BRIEF DESCRIPTION OF THE DRAWINGS

FIG. 7 is a diagram illustrating a transfer address in the configuration of FIG. 6.

FIG. 8 is a diagram illustrating assurance of a pseudo un-used address in the configuration of FIG. 6.

FIG. 10 is a diagram illustrating a transfer address in the configuration of FIG. 9.

FIG. 11 is a diagram illustrating pseudo assurance of an un-used address in the configuration of FIG. 9.

DETAILED DESCRIPTION OF PREFERRED EMBODIMENTS

Figure 1:
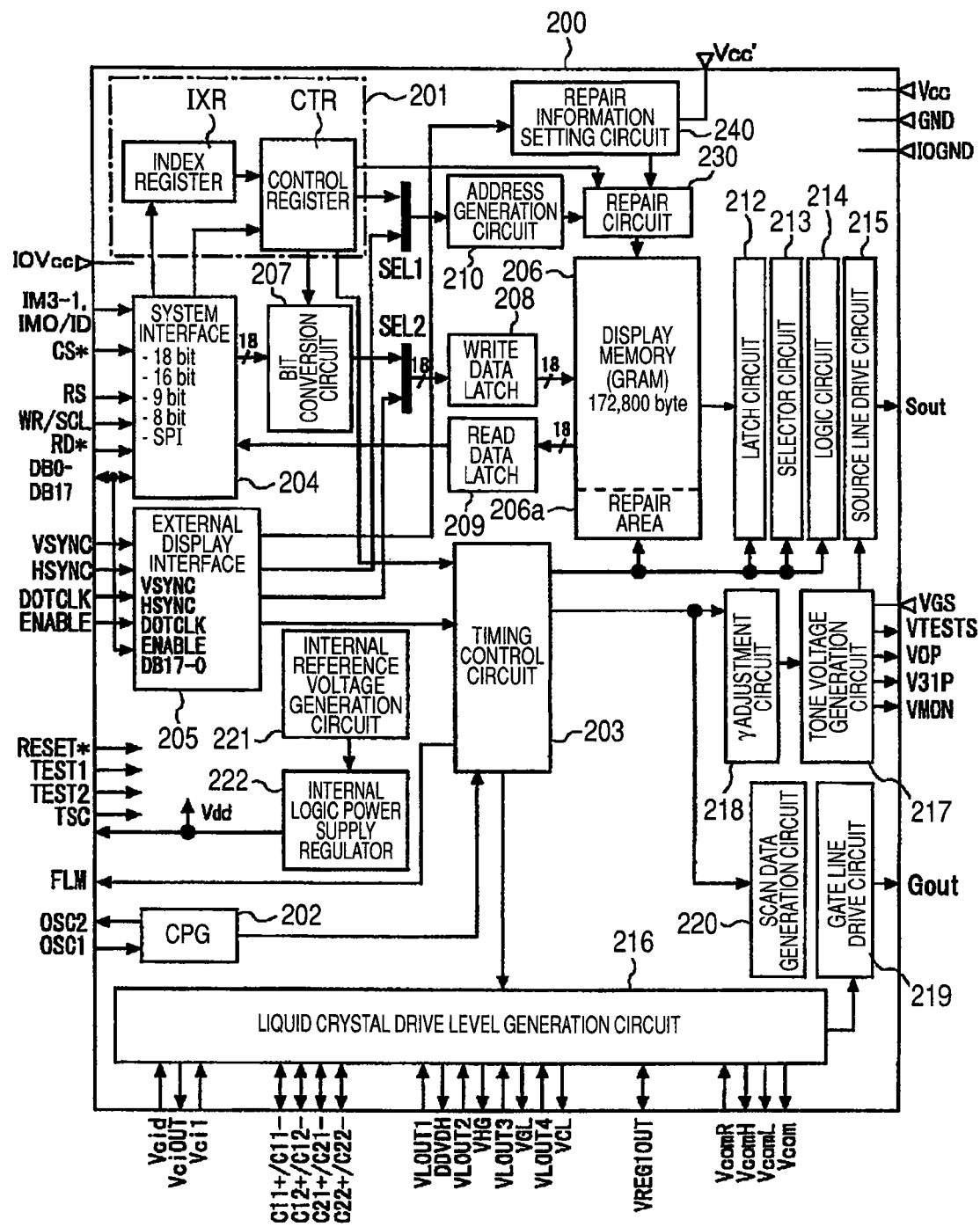
FIG. 1 is a block diagram showing a configuration example of a liquid crystal controller driver as an example of a semiconductor integrated circuit device for a display controller according to the present invention.

FIG. 1 shows a liquid crystal display (LCD) controller driver (hereinbelow, called a liquid crystal controller driver) as an example of a semiconductor integrated circuit device for a display controller according to the present invention.

A liquid crystal controller driver 200 shown in FIG. 1 has therein a RAM (hereinbelow, called display memory) as a memory for storing data graphically displayed on a dot-matrix-type liquid crystal display panel. The liquid crystal controller driver 200 is constructed as a semiconductor integrated circuit together with a write circuit, a read circuit, and a driver for outputting a drive signal of the liquid crystal display panel on a single semiconductor substrate.

The liquid crystal controller driver 200 has a controller 201 for controlling the entire inside of a chip on the basis of a command from an external microprocessor or microcomputer (hereinbelow, called microcomputer) or the like. The liquid crystal controller driver 200 also has a pulse generator 202 for generating a reference clock pulse in the chip on the basis of an oscillation signal from the outside or an oscillation signal from an oscillator connected to an external terminal, and a timing control circuit 203 for generating a timing signal that gives operation timings of various circuits in the chip on the basis of the clock pulse.

The liquid crystal controller driver 200 also has a system interface 204 for mainly transmitting/receiving data such as an instruction and stationary display data to/from the microcomputer or the like via a not-shown system bus, and an external display interface 205 for receiving moving picture data and horizontal and vertical sync signals HSYNC and VSYNC mainly from an application processor or the like via a not-shown display data bus.

The liquid crystal controller driver 200 also has: a display memory 206 for storing display data in a bit map method; a bit conversion circuit 207 for performing a bit process such as rearrangement of bits of RGB write data from the microcomputer; a write data latch 208 for latching and holding display data converted by the bit conversion circuit 207 or display data input via the external display interface 205; a read data latch circuit 209 for holding display data read from the display memory 206; and an address generation circuit 210 for generating a selection address to the display memory 206.

The display memory 206 is constructed by a memory array including a plurality of memory cells, word lines, and bit lines (data lines), and a readable and writable RAM having an address decoder for decoding an address supplied from the address generation circuit 210 and generating a signal for selecting a word line and a bit line in the memory array. The display memory 206 also includes a sense amplifier for amplifying a signal read from a memory cell and a write driver for applying a predetermined voltage to a bit line in the memory array in accordance with write data. Although not limited, in the embodiment, the memory array has a storage capacity of 172,800 bytes, and data can be read/written on a column unit basis (18 bits) by a 17-bit address signal.

The liquid crystal controller driver 200 also includes a latch circuit 212 for sequentially latching display data read from the display memory 206, a selector circuit 213 capable of selectively transmitting the latched display data to a following circuit, and a logic circuit 214 for receiving the display data selectively transmitted by the selector circuit 213. The logic circuit 214 includes an AC circuit for generating data for AC driving that prevents degradation of the liquid crystal from the display data selectively transmitted from the selector circuit 213, and a latch circuit for latching the data generated by the AC circuit. The liquid crystal controller driver 200 also includes a liquid crystal drive level generation circuit 216 for generating voltages of a plurality of levels necessary to drive a liquid crystal panel, a tone voltage generation circuit 217 for generating a tone voltage necessary for generating a waveform signal adapted to color display and tone display on the basis of the voltage generated by the liquid crystal drive level generation circuit 216, and a γ adjustment circuit 218 for setting a tone voltage for correcting the γ characteristic of the liquid crystal panel.

At the post stage of the logic circuit 214, a source line drive circuit 215 is provided. The source line drive circuit 215 outputs a voltage (source line drive signal) Sout to be applied to a source line as a signal line in the liquid crystal panel by selecting a voltage according to the output data of the logic circuit 214 from the tone voltage supplied from the tone voltage generation circuit 217. The liquid crystal controller driver 200 also includes a gate line drive circuit 219 for outputting a voltage (gate line drive signal) Gout to be applied to a gate line (also called a common line) as a selection line in the liquid crystal panel, and a scan data generation circuit 220 formed by a shift register or the like for generating scan data for sequentially driving the gate lines in the liquid crystal panel one by one to the selection level.

Further, the liquid crystal controller driver 200 includes an internal reference voltage generation circuit 221 for generating an internal reference voltage, and a voltage regulator 222 for generating a power supply voltage Vdd of an internal logic circuit such as 1.5V by decreasing a voltage Vcc such as 3.3V or 2.5V supplied from the outside. In FIG. 1, SEL1 and SEL2 denote data selectors which are controlled by a switching signal output from the timing control circuit 203 to selectively pass any of a plurality of input signals.

The controller 201 is provided with registers such as a control register CTR for controlling an operation state of the entire chip such as an operation mode of the liquid crystal controller driver 200, and an index register IXR for storing index information for referring to the control register CTR and the display memory 206. When an instruction to be executed is designated by writing data to the index register IXR from an external microcomputer or the like, the controller 201 generates and outputs a control signal according to the designated instruction.

By the control of the controller 201 constructed as described above, the liquid crystal controller driver 200 performs a drawing process of sequentially writing display data to the display memory 206 at the time of displaying data on a not-shown liquid crystal panel on the basis of an instruction and data from the microcomputer or the like. A reading process of cyclically reading display data from the display memory 206 is performed, a signal to be applied to a source line in the liquid crystal panel is generated and output, and a signal to be sequentially applied to a gate line is generated and output.

The system interface 204 transmits/receives signals such as setup data and display data to the registers necessary for drawing data to the display memory 206, to/from a system controller such as the microcomputer. In the embodiment, any of 18-bit, 16-bit, 9-bit, and 8-bit parallel input/output or serial input/output interfaces can be selected as an 80-series interface in accordance with the state of IM3-1 and IM0/ID terminals.

The liquid crystal controller driver 200 has a repair circuit 230 for repairing a defective bit in the display memory 206 and a repair information setting circuit 240 for holding, as repair information, the address of a memory row to be repaired including the defective bit. The repair information setting circuit 240 is, although not limited, a fuse circuit capable of storing the address of a memory row or column to be repaired. According to the repair information set in the repair information setting circuit 240, the repair circuit 230 replaces a region including the defective bit in the display memory 206 with a redundant region on a word line unit basis or a data line unit basis. The display memory 206 includes a repair area (spare storage area) 206a provided separately from the regular storage area for storing display data. The repair area 206a includes a word line repair area for repairing a word line and a data line repair area for repairing a data line. Redundant repair by the repair circuit 230 is performed on the basis of the setup information of the repair information setting circuit 240 in each of the case of writing display data to the display memory 206 via the write data latch circuit 208, the case of reading data stored in the display memory 206 to the system side via the read data latch circuit 209, and the case of reading data stored in the display memory 206 via the latch circuit 212. In the case of reading the display data from the display memory 206 and outputting the read display data to the latch circuit 212 at the following stage, repair on the word line unit basis does not have to correspond to a display position in the liquid crystal display. It is sufficient to change an address to be selected. To repair a data line, the position of data has to be replaced so as to correspond to the display position in the liquid crystal display. The position of data is replaced as follows.

Figure 2:
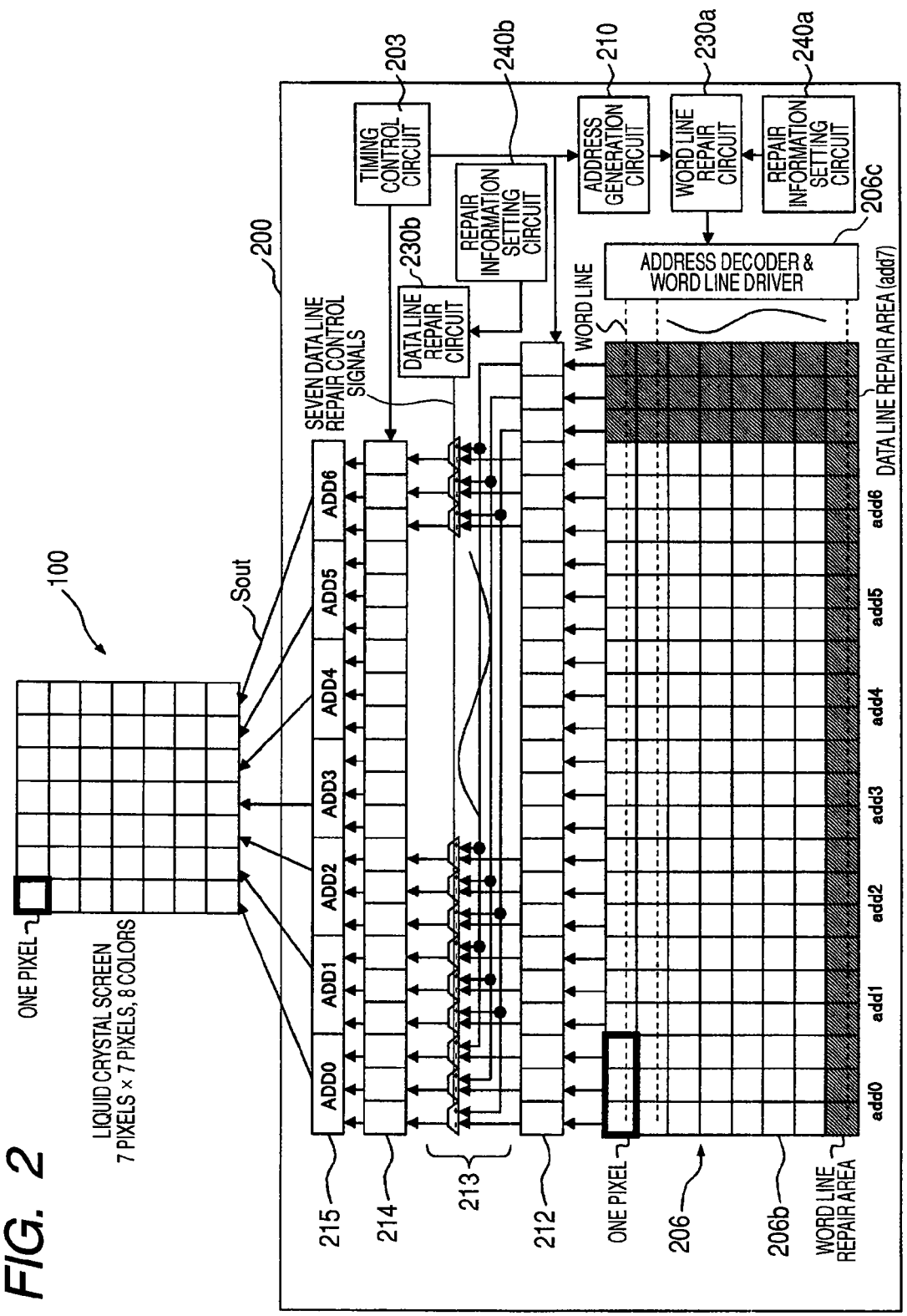
FIG. 2 is a block diagram showing a configuration example of a main part in the liquid crystal controller driver.

FIG. 2 shows the relation of the main components in the liquid crystal controller driver 200 with a liquid crystal display.

A liquid crystal display 100 shown in FIG. 2 is, although not limited, an 8-color display of 7 pixels by 7 pixels. One pixel is constructed by three dots of red, green, and blue. A source line drive signal Sout from the liquid crystal controller driver 200 is supplied to the liquid crystal display 100. To the liquid crystal display 100, a gate line drive signal Gout (not shown) from the liquid crystal controller driver 200 is also supplied.

The display memory 206 includes a memory cell array 206b in which a plurality of memory cells are arranged in an array shape, and an address decoder and word line driver 206c for decoding an input address signal and generating a signal for driving a word line to the selection level. The memory cell array 206b has the repair area 206a. The repair area 206a includes a word line repair area for repairing a word line and a data line repair area for repairing a data line.

As shown in FIG. 2, the repair information setting circuit 240 shown in FIG. 1 includes a repair information setting circuit 240a capable of setting repair information of a word line, and a repair information setting circuit 240b capable of setting repair information of a data line. As shown in FIG. 2, the repair circuit 230 shown in FIG. 1 includes a word line repair circuit 230a for repairing a word line in accordance with the repair information which is set in the repair information setting circuit 240a, and a data line repair circuit 230b for repairing a data line in accordance with repair information which is set in the repair information setting circuit 240b.

The selector circuit 213 is disposed on the transmission path of output data from the display memory 206 and between the latch circuit 212 and the logic circuit 214. The selector circuit 213 has the function of selectively replacing the output data from a regular storage area with output data from the spare storage area in accordance with a control signal from the repair circuit. The latch circuit 212 includes a plurality of latches corresponding to the regular storage area in the display memory 206 and a plurality of latches corresponding to an area for repairing a data line. Each of the plurality of latches is coupled to a data output terminal in the display memory 206. Data output from the output terminal in the display memory 206 is transmitted to the selector circuit 213 at the following stage via the corresponding latch.

The selector circuit 213 includes a plurality of selectors corresponding to a plurality of latches corresponding to the normal storage area in the display memory 206. Each of the plurality of selectors has two input terminals shown as "−" and "+" in FIG. 2, and data transmitted to the two input terminals is selectively transmitted to the logic circuit 214 at the post stage. The selecting operation is controlled by a data line repair signal which is output from the data line repair circuit 230b. To the input terminals "−" in the plurality of selectors, output data from corresponding latches in the latch circuit 212 is transmitted. To the input terminals "+" in the plurality of selectors, output data from latches corresponding to the data line repair area is transmitted.

Figure 3:
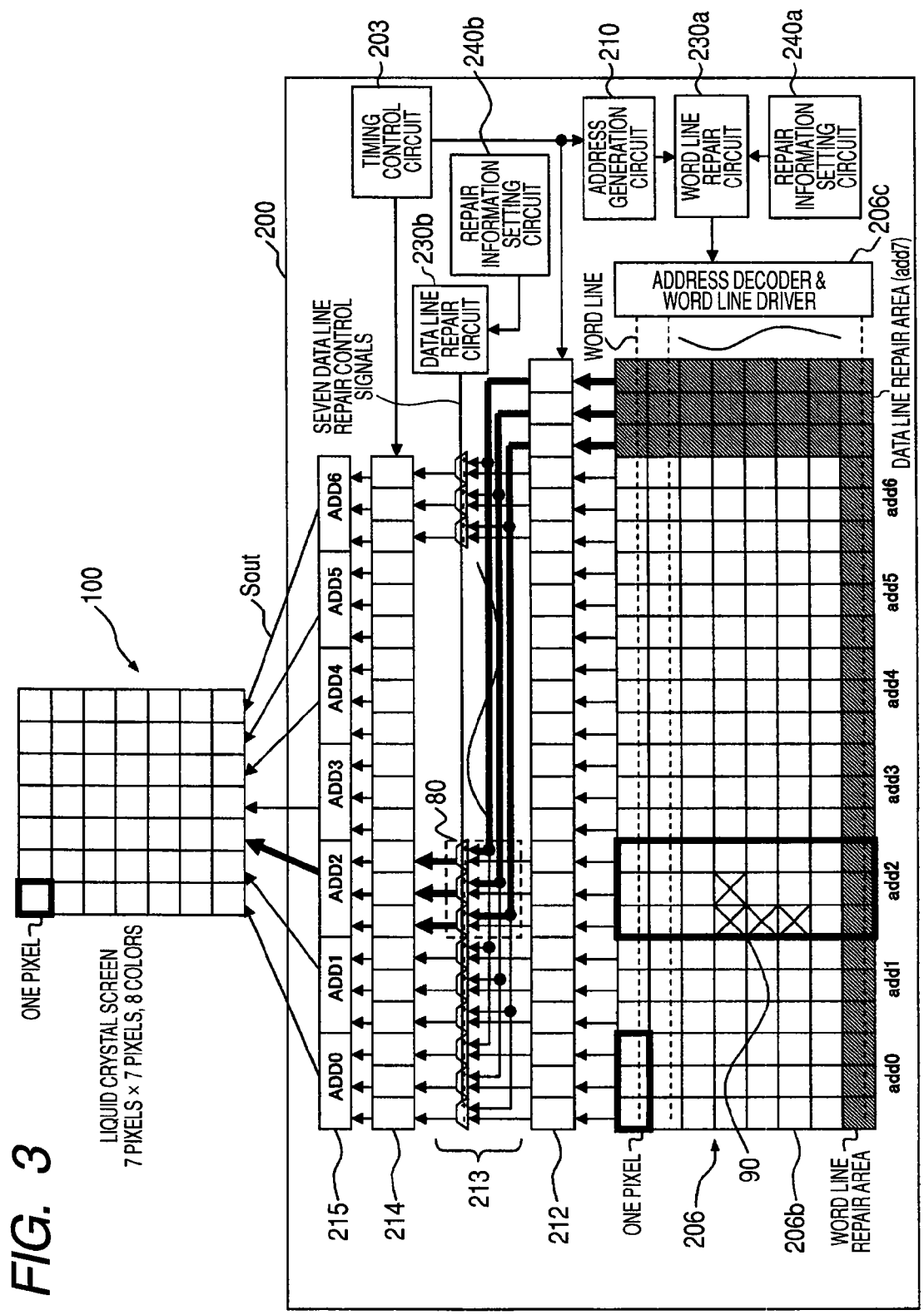
FIG. 3 is a block diagram showing another configuration example of the main part in the liquid crystal controller driver.

FIG. 3 shows a state of redundancy repair with the configuration shown in FIG. 2.

In a performance test, as shown in FIG. 3, in the case where areas indicated by marks X are determined as defective parts in the regular storage area in the display memory 206, information indicating that an area 90 as a target of data line repair including the defective parts, that is, an area corresponding to the transfer address add2 is defective is set in the repair information setting circuit 240b. After the repair information setting is made, by controlling the operation of the selector circuit 213 on the basis of a data line repair signal from the data line repair circuit 230b, in place of output data from the area 90 as a target of data line repair (area corresponding to the transfer address add2) including the defective parts, output data from a data line repair area (area corresponding to a transfer address add7) is selectively transmitted to the logic circuit 214. Specifically, in the selector circuit 213, the latches corresponding to transfer addresses add0, add1, add3, add4, add5, and add6 selectively transmit data transmitted to the input terminals "−" to the logic circuit 214. Latches (indicated as 80) corresponding to the transfer address add2 selectively transmit data transmitted to the input terminals "+", that is, data from the data line repair area corresponding to the transfer address add7 to the logic circuit 214. By controlling the operation of the selector circuit 213 on the basis of the data line repair signal from the data line repair circuit 230b, in place of output data from the area 90 as the target of data line repair including the defective parts (the area corresponding to the transfer address add2), output data from the data line repair area (the area corresponding to the transfer address add7) is selectively transmitted to the logic circuit 214. In such a manner, the data line repair is performed.

In the case where repair using the word line repair area is preferable, repair information is set in the repair information setting circuit 240a. In the case where the output address of the address generation circuit 210 matches the repair information which is set in the repair setting circuit 240a in the word line, by driving the word line in the word line repair area to the selection level in place of the word line in the regular storage area, repair on the word line unit basis is performed.

In the embodiment, the following effects can be obtained.

(1) In the case of reading display data from the memory array and outputting the display data to the circuit at the next stage, it is unnecessary to perform the repair on the word line unit basis in correspondence with the display position in the liquid crystal display 100 but it is sufficient to change an address to be selected. However, to repair a data line, the position of data has to be replaced so as to correspond to a display position in the display. In the configuration shown in FIG. 2, by providing the selector circuit 213, the position of data is replaced. Thus, a data line can be repaired easily.

(2) In a redundancy circuit employed in a general RAM, a control circuit for selecting a regular memory row or column and a control circuit for selecting a spare memory row or column (redundant memory) to be replaced with a defective bit are separately provided. Consequently, the operation characteristic such as reading speed varies between an access to a regular memory row or column and an access to a spare memory row or column, so that designing of timings of peripheral circuits of the memory is difficult. In the foregoing embodiment, it is unnecessary to construct the control circuit for selecting a regular row or column and the control circuit for selecting a spare row or column to be replaced with a defective bit as separate circuits. Thus, the designing of timings of peripheral circuits of the display memory 206 is facilitated.

Figure 4:
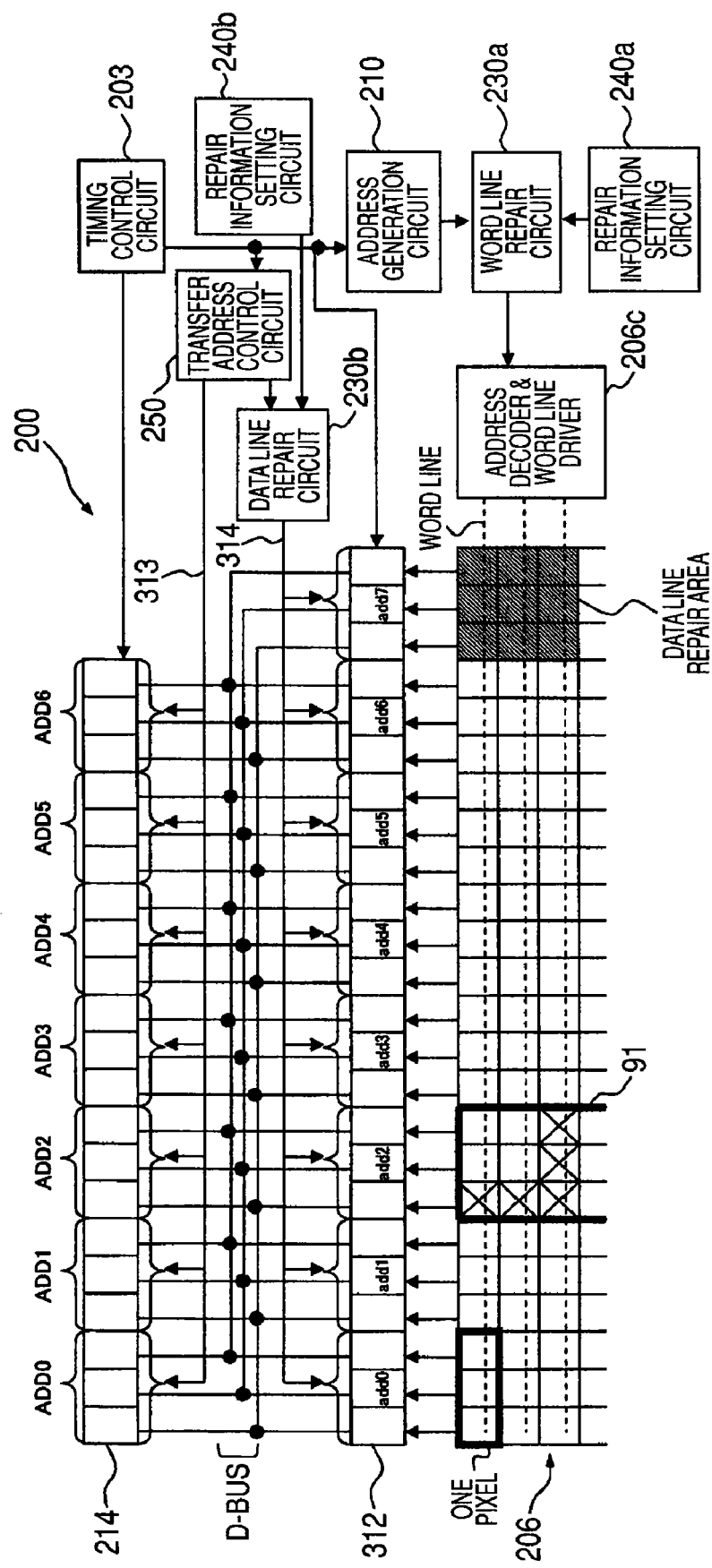
FIG. 4 is a block diagram showing another configuration example of the main part in the liquid crystal controller driver.

FIG. 4 shows another configuration example of the main part in the liquid crystal controller driver 200.

The configuration shown in FIG. 4 is largely different from that shown in FIG. 2 with respect to the point that output data of the display memory 206 is received by a clocked inverter circuit 312 as an example of a tri-state (high, low, and high impedance) circuit and a data bus D-BUS using a common address is provided between the clocked inverter circuit 312 and the logic circuit 214, and the point that a transfer address control circuit 250 for controlling a transfer address is provided.

The clocked inverter circuit 312 includes a plurality of clocked inverters disposed in correspondence with output terminals of the display memory 206. To the plurality of clocked inverters, transfer addresses add0 to add7 are assigned every data size corresponding to one pixel. Similarly, the logic circuit 214 includes a plurality of logic circuits, and transfer addresses ADD0 to ADD6 are assigned to the plurality of logic circuits every data size corresponding to one pixel. The clocked inverter circuit 312 and the logic circuit 214 are subject to a time division control by the transfer addresses. By the time division control, an output signal of the clocked inverter circuit 312 is transmitted to the logic circuit 214 via the data bus D-BUS.

Figure 5:
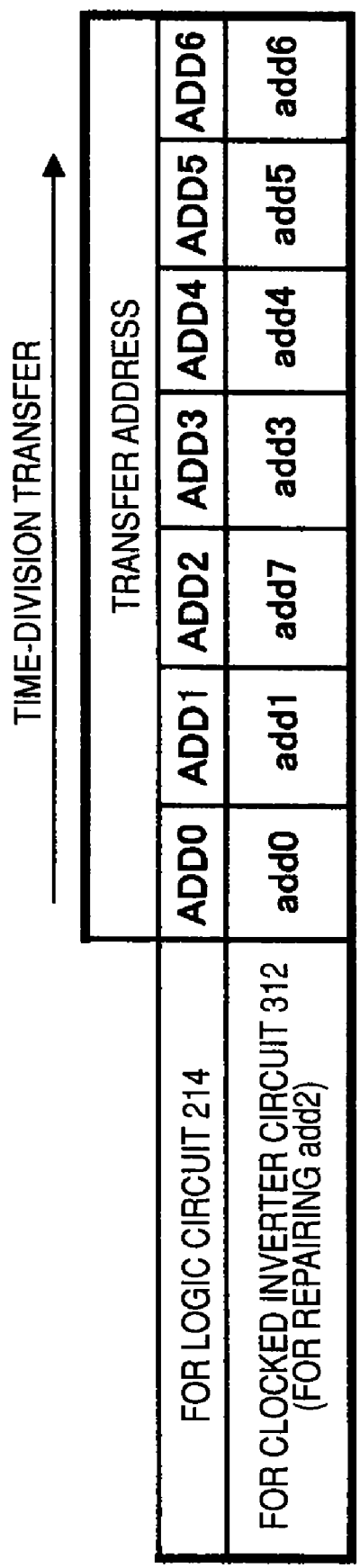
FIG. 5 is a diagram illustrating a transfer address in the configuration of FIG. 4.

A transfer address signal 313 is supplied from the transfer address control circuit 250 to the logic circuit 214, and a transfer address signal 314 is supplied from the transfer address control circuit 250 to the clocked inverter circuit 312 via the data line repair circuit 230b. With the transfer address signal 313, the time division control on the transfer addresses ADD0 to ADD6 is performed. With the transfer address signal 314, the time division control on the transfer addresses add0 to add7 is performed. The data line repair circuit 230b replaces the transfer address in accordance with the repair information which is set in the repair information setting circuit 240b. For example, when an area indicated by 91 is a target of the data line repair, as shown in FIG. 5, the transfer address add2 corresponding to the area 91 as the target of the data line repair is replaced with the transfer address add7 corresponding to the data line repair area in the data line repair circuit 230b. Therefore, under the time division control, data is output to the data bus D-BUS in order of the transfer addresses add0, add1, add7, add3, add4, add5, and add6 from the clocked inverter circuit 312. At this time, the logic circuit 214 latches data from the data bus D-BUS in order of the transfer addresses ADD0, ADD1, ADD2, ADD3, ADD4, ADD5, and ADD6. In the time division transfer from the clocked inverter 312 to the logic circuit 214, by transmitting output data from the data line repair area to the logic circuit 214 in place of the output data from the area 91 as the target of the data line repair, the data line repair is performed.

By the foregoing embodiment, the following effects can be obtained.

(1) In the case of reading display data from the memory array and outputting the display data to the circuit at the following stage, repair on the word line unit basis does not have to correspond to a display position in the display. It is sufficient to change an address to be selected. To repair a data line, the position of data has to be replaced so as to correspond to the display position in the display. In the configuration of FIG. 4, output data of the display memory 206 is received by the clocked inverter circuit 312, and the data bus D-BUS using a common address is provided between the clocked inverter circuit 312 and the logic circuit 214 and, further, the transfer address control circuit 250 for controlling a transfer address is provided. With the configuration, in place of the clocked inverter corresponding to the area including the defect in the display memory 206, the clocked inverter corresponding to the spare storage area is allowed to enter a data output state, thereby replacing the position of data. Thus, a data line can be easily repaired.

(2) With the configuration shown in FIG. 4, the selector circuit 213 shown in FIG. 2 is unnecessary, so that the chip area can be reduced.

Figure 6:
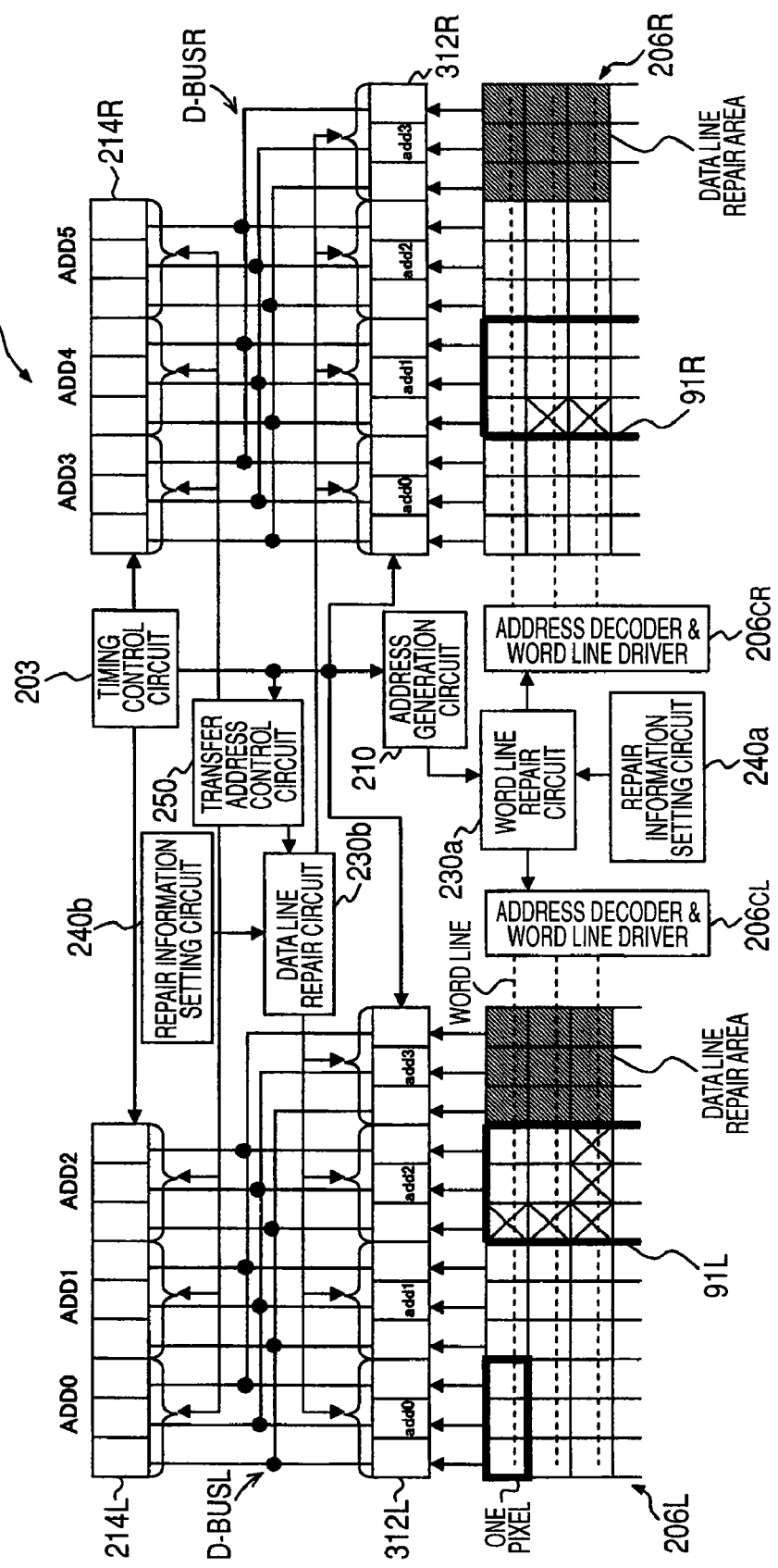
FIG. 6 is a block diagram showing another configuration example of the main part in the liquid crystal controller driver.

FIG. 6 shows another configuration example of the main part in the liquid crystal controller driver 200.

The liquid crystal controller driver 200 shown in FIG. 6 is largely different from that shown in FIG. 4 with respect to the point that the display memory 206 is divided into mats, and peripheral circuits are disposed in association with the mat division. Although not limited, the display memory 206 is divided into a left mat 206L and a right mat 206R. For the left mat 206L, a clocked inverter circuit 312L, a data bus D-BUSL, a logic circuit 214L, and an address decoder and word line driver 206CL are disposed. For the right mat 206R, a clocked inverter circuit 312R, a data bus D-BUSR, a logic circuit 214R, and an address decoder and word line driver 206CR are disposed. Each of the left mat 206L and the right mat 206R has a storage area smaller than an address space of the n-th power of 2. The "n" denotes a positive integer excluding 0 (1, 2, 3, . . . ). This operation intends to assure a transfer address of a data line repair area in each of the right and left mats 206R and 206L and assign it to the clocked inverter corresponding to a spare storage area. That is, in the case where each of the right and left mats 206R and 206L is set to a storage area smaller than the address space of the n-th power of 2 (in the example, 3 which is smaller than $2^2$), as shown in FIG. 8, pseudo un-used addresses "11" and "10" when attention is paid only to the lower addresses A1 and A0 out of three-bit addresses A2, A1, and A0 are assured. In the data line repair circuit 230b, a data line repair area in the left mat 206L is selected by the un-used address "11", and a data line repair area in the right mat 206R is selected by the un-used address "10".

For example, in FIG. 6, in the case where areas indicated by 91L and 91R are targets of the data line repair, the areas are repaired as follows. The data line repair circuit 230b selects "11" on the mat 206L side in place of the address "010" on the basis of storage information of the repair information setting circuit 240b. In the time division transfer, as shown in FIG. 7, in place of the transfer address add2 on the left mat 206L side, the clocked inverter corresponding to add3 is made active. In place of the transfer address add1 on the right mat 206R side, the clocked inverter corresponding to add3 is made active.

In the embodiment, the following effects can be obtained.

Even in the case where the display memory 206 is divided into mats, by receiving output data of the right and left mats 206R and 206L by the clocked inverter circuits 312R and 312L, respectively, providing the data buses D-BUSR and D-BUSL between the clocked inverter circuits 312R and 312L and the logic circuits 214R and 214L, and providing the transfer address control circuit 250 for transfer address control, the clocked inverter corresponding to the spare storage area is allowed to enter the data output state in place of the clocked inverter corresponding to the area including a defect in the right and left mats 206R and 206L, thereby replacing the position of data. Thus, in a manner similar to the case shown in FIG. 4, a data line can be easily repaired.

Figure 9:
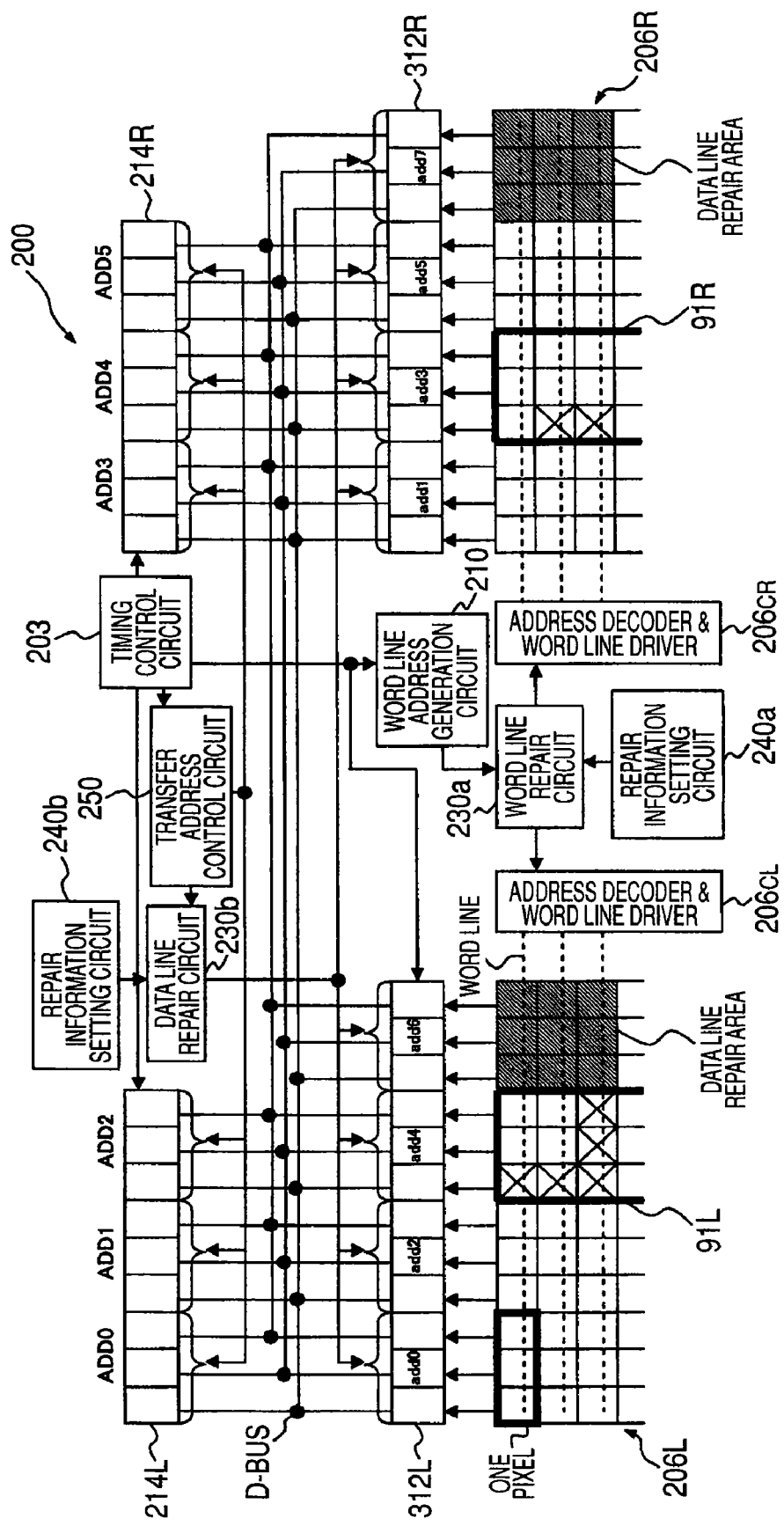
FIG. 9 is a block diagram showing another configuration example of the main part in the liquid crystal controller driver.

FIG. 9 shows another configuration example of the main part in the liquid crystal controller driver 200.

The liquid crystal controller driver 200 shown in FIG. 9 is largely different from that shown in FIG. 6 with respect to the point that the data bus D-BUS is not divided in correspondence with the right and left mats 206R and 206L.

A transfer address signal supplied from the data lien repair circuit 230b to the clocked inverter circuits 312R and 312L has a 3-bit configuration (A2, A2, A1) as shown in FIG. 11. When the A0 bit is "0", the clocked inverter circuit 312L is selected. When the A0 bit is "1", the clocked inverter circuit 312R is selected. When A1 and A2 bits are set as attention bits, according to the A1 and A2 bits, the clocked inverters in the clocked inverter circuits 312L and 312R are made active.

FIG. 10 shows the relation between the transfer address for the logic circuits 214R and 214L and the transfer addresses for the clocked inverter circuits 312R and 312L.

Areas indicated by 91L and 91R are targets of the data line repair. By selecting the transfer address add6 in place of the transfer address add4 for the clocked inverter corresponding to the data line repair area 91L under the control of the data line repair circuit 230b, the data line repair area in the left mat 206L is used. By selecting the transfer address add7 in place of the transfer address add3 for the clocked inverter corresponding to the data line repair area 91R, the data line repair area in the left mat 206L is used.

In the embodiment, the following effects can be obtained.

(1) Even in the case where the display memory 206 is divided into mats, by receiving output data of the right and left mats 206R and 206L by the clocked inverter circuits 312R and 312L, respectively, providing the data bus D-BUS between the clocked inverter circuits 312R and 312L and the logic circuits 214R and 214L, and providing the transfer address control circuit 250 for transfer address control, the clocked inverter corresponding to the spare storage area is allowed to enter the data output state in place of the clocked inverter corresponding to the area including a defect in the right and left mats 206R and 206L, thereby replacing the position of data. Thus, in a manner similar to the case shown in FIG. 4, a data line can be easily repaired.

(2) Since the data bus D-BUS is not divided in correspondence with the right and left mats 206R and 206L, the arrangement of data for the transfer addresses ADD0 to ADD5 in the logic circuits 214R and 214L can be arbitrarily changed.

Figure 12:
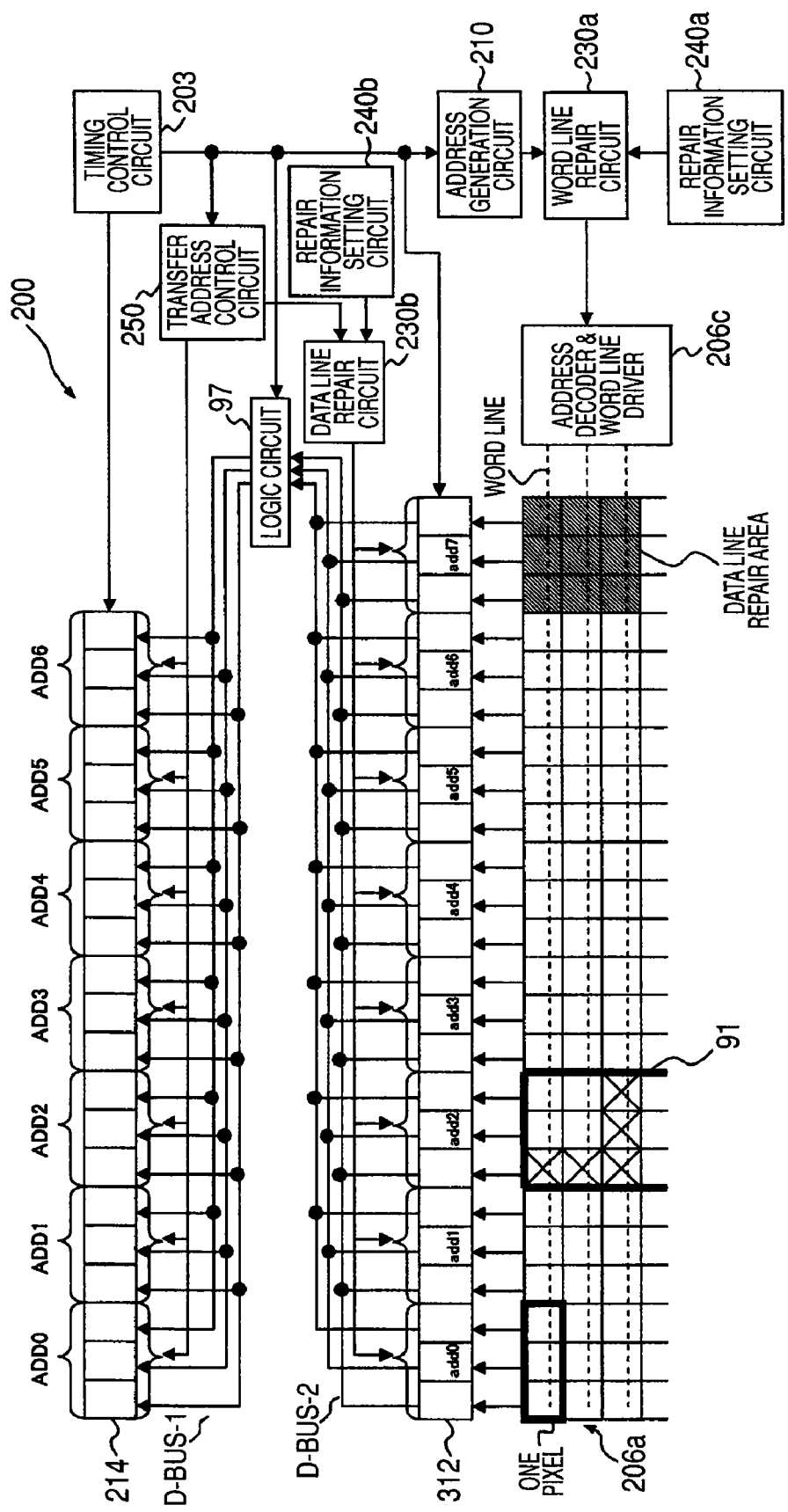
FIG. 12 is a block diagram showing another configuration example of the main part in the liquid crystal controller driver.

FIG. 12 shows another configuration example of the main part in the liquid crystal controller driver 200.

The liquid crystal controller driver 200 shown in FIG. 12 is largely different from that shown in FIG. 4 with respect to the point that a logic-circuit-side data bus D-BUS-1 is disposed on the logic circuit 214 side, a clocked-inverter-circuit-side data bus D-BUS-2 is disposed on the clocked inverter circuit 312 side, and a logic circuit 97 is disposed between the logic-circuit-side data bus D-BUS-1 and the clocked-inverter-circuit-side data bus D-BUS-2. Processes in the logic circuit 97 include a color converting process for converting display colors and a double size process for changing the size of a character.

In the embodiment, the following effects can be obtained.

(1) In the case where the logic circuit 97 is disposed between the logic-circuit-side data bus D-BUS-1 and the clocked-inverter-circuit-side data bus D-BUS-2, in a manner similar to FIG. 6, the clocked inverter corresponding to the spare storage area is allowed to enter the data output state in place of the clocked inverter corresponding to the area including a defect in the display memory 206, thereby replacing the position of data. Thus, a data line can be easily repaired.

(2) Since the logic circuit 97 is disposed between the logic-circuit-side data bus D-BUS-1 and the clocked-inverter-circuit-side data bus D-BUS-2, imaging processes such as the color converting process and the double size process can be performed on display data in a lump.

Figure 13:
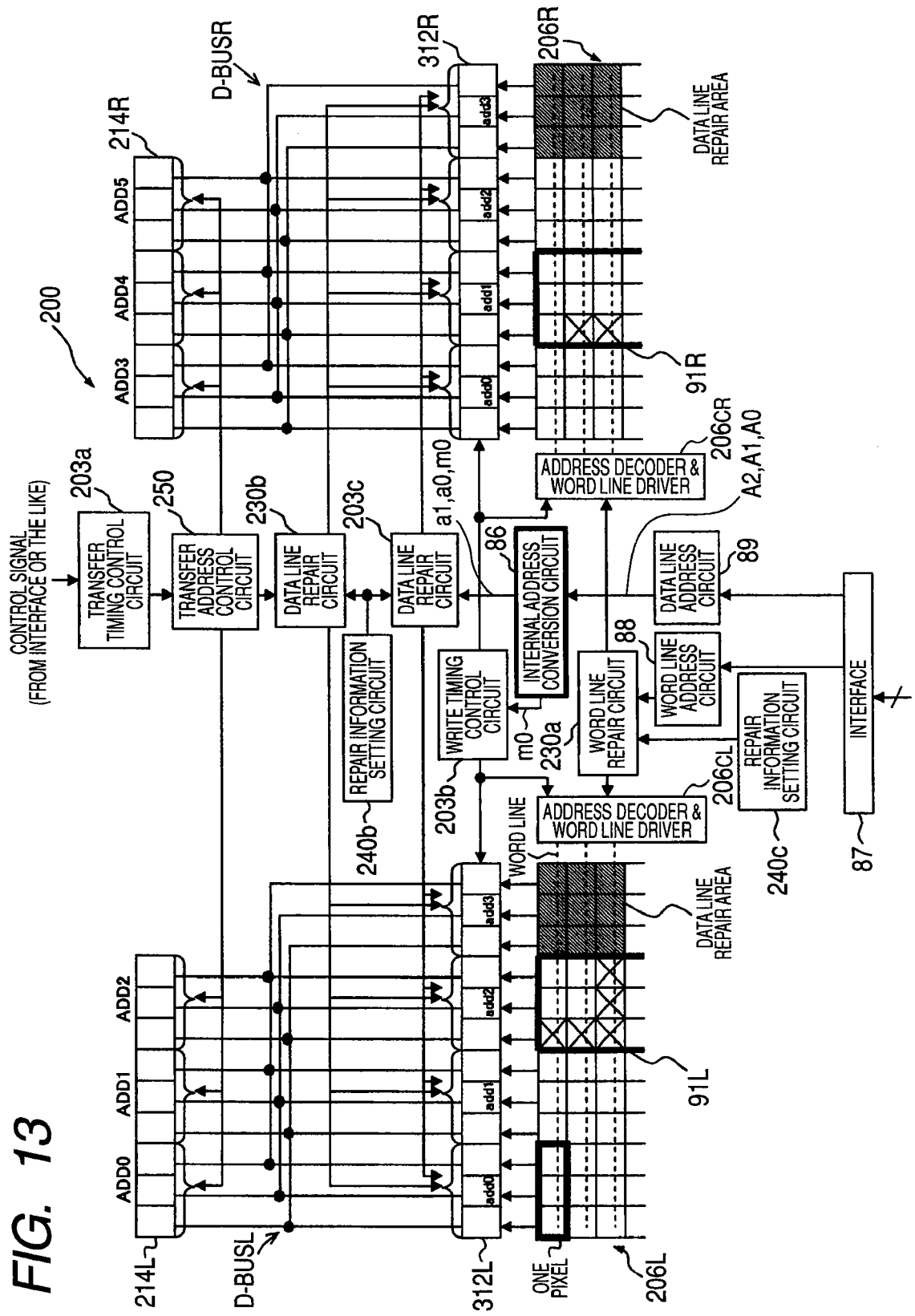
FIG. 13 is a block diagram showing another configuration example of the main part in the liquid crystal controller driver.

FIG. 13 shows another configuration example of the main part in the liquid crystal controller driver 200.

The liquid crystal controller driver 200 shown in FIG. 13 is largely different from that shown in FIG. 4 with respect to the point that internal/external addresses are converted to an internal address. A word line address signal and a data line address signal are received via an interface 87. The word line address signal is transmitted to a word line address control circuit 88. Word line repair information is set in a repair information setting circuit 240c. The word line repair circuit 230a repairs a word line in accordance with the word line repair information which is set in the repair information setting circuit 240c. Data line address signals A2, A1, and A0 received from the outside via the interface 87 are transmitted to an internal address conversion circuit 86 via a data line address control circuit 89. The internal address conversion circuit 86 converts the input data line address signals A2, A1, and A0 to internal address signals a1 and a0 and a mat selection signal m0. The internal address signals a1 and a0 and the mat selection signal m0 are transmitted to a data line repair circuit 230c disposed at a post stage. The data line repair circuit 230c compares the data line address signal transmitted from the internal address conversion circuit 86 with repair information which is set in the repair information setting circuit. When the data line address signal coincides with the repair information, the data write address in the display memory 206 is replaced in order to repair a data line. The mat selection signal m0 is transmitted to a write timing control circuit 203b. The write timing control circuit 203b selects a mat at the time of writing data to the display memory 206 on the basis of the mat selection signal m0. Data to be written is latched via the write data latch 208.

The transfer timing control circuit 203a is provided. The transfer timing control circuit 203a controls the transfer timing on the basis of a control signal transmitted via a not-shown interface or the like. The transfer address control circuit 250 is provided. The transfer address control circuit 250 generates a transfer address signal for selectively making the logic circuits 214R and 214L enter a write state synchronously with the timing control signal from the transfer timing control circuit 203*a*. The data line repair circuit 230*b* compares the transfer address signal transmitted from the transfer address control circuit 250 with repair information which is set in the repair information setting circuit 240*b*. When the transfer address signal coincides with the repair information, the transfer address signal for activating each of clocked inverters in the clocked inverter circuits 312R and 312L is replaced in order to repair a data line. The case of replacing data by time division transfer when the areas 91R and 91L are targets of data line repair is similar to, for example, the case of the configuration shown in FIG. 6. The detailed description of the case will not be repeated.

Figure 14:
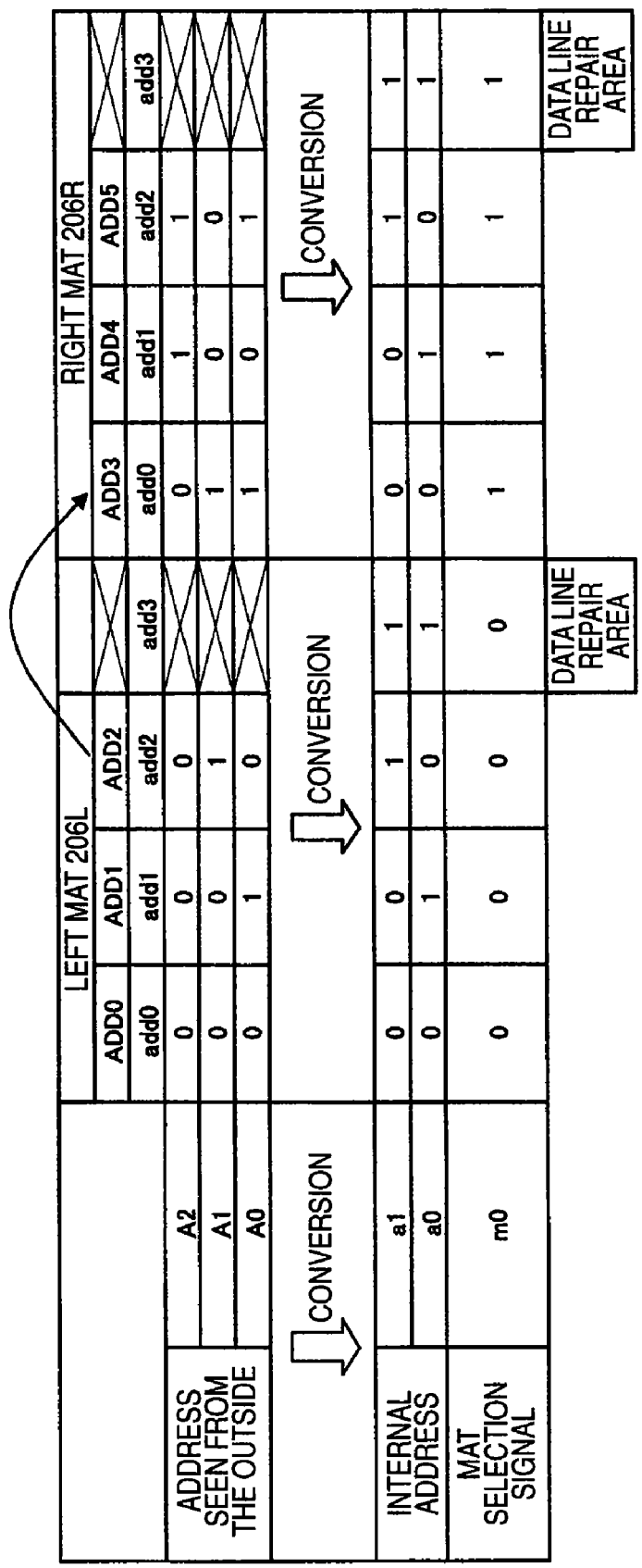
FIG. 14 is a diagram illustrating the correspondence relation between en external address and an internal address in the configuration of FIG. 13.

FIG. 14 shows the correspondence relation between external addresses (data line addresses A2, A1, and A0) and internal addresses. In the case of performing control only with addresses seen from the outside without performing internal address conversion, A2, A1, and A0 corresponding to add0, add1, and add2 vary among mats. In contrast, when the internal address conversion is performed in the configuration shown in FIG. 13, the internal addresses (a1, a0) in the mats are repeated. In the external addresses, ADD2 ad ADD3 (add2 in the left mat and add0 in the right mat) are continuous, so that handling of the display memory 206 in manufacture of the liquid crystal controller driver 200 is easy.

In the embodiment, the following effects can be obtained.

(1) The clocked inverter corresponding to the spare storage area is allowed to enter the data output state in place of the clocked inverter corresponding to the area including a defect in the right and left mats 207R and 207L, thereby replacing the position of data. Thus, in a manner similar to the cases shown in FIGS. 4, 6, and 9, a data line can be easily repaired.

(2) By performing the internal address conversion, the internal addresses (a1, a0) in the mats are repeated. Consequently, there is an advantage such that the larger the number of mats is, the easier the control, layout designing, and verification are. Since the address corresponding to the data line repair area (redundant area) becomes the same in all of the mats, handling of repair information is also facilitated. For example, when repair is unnecessary, it is sufficient to set the repair information as "11". In the case of repairing a data line at the left end of a mat, it is sufficient to set "00". Therefore, the repair information can be simplified.

Figure 15:
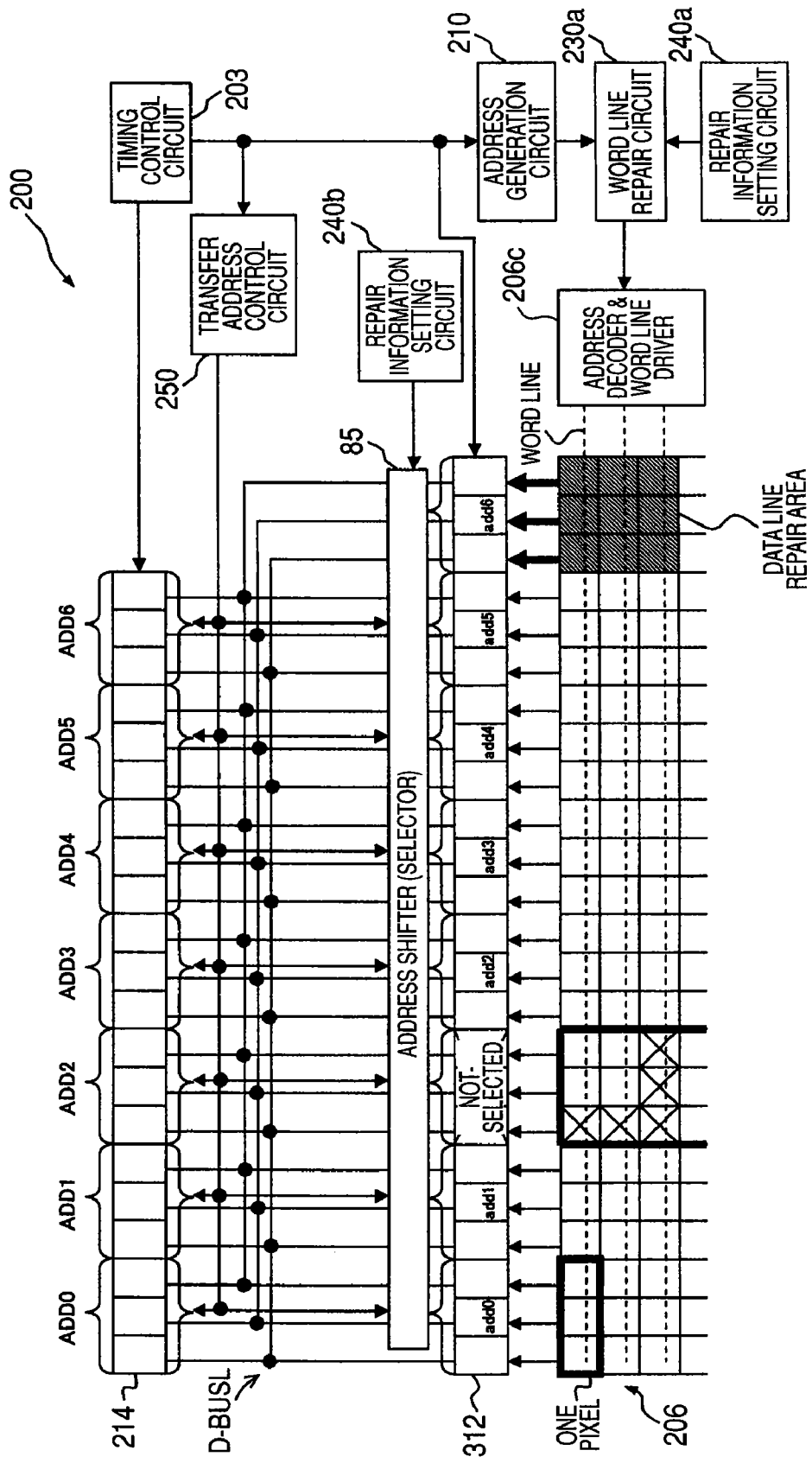
FIG. 15 is a block diagram showing another configuration example of the main part in the liquid crystal controller driver.

FIG. 15 shows another configuration example of the main part in the liquid crystal controller driver 200.

Figure 16:
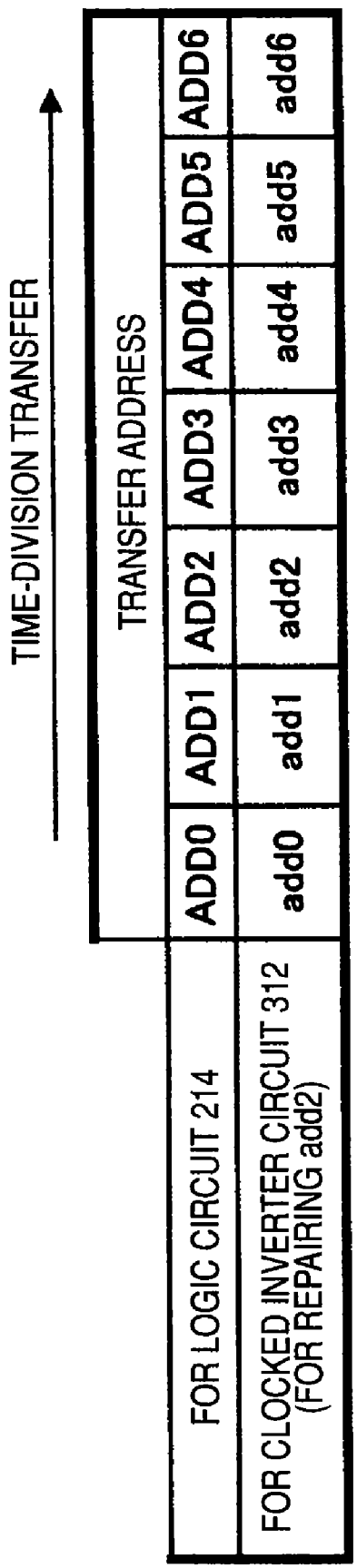
FIG. 16 is a diagram illustrating a transfer address in the configuration of FIG. 15.

The liquid crystal controller driver 200 shown in FIG. 15 is largely different from that shown in FIG. 4 with respect to the point that an address shifter 85 for shifting an address is provided between the clocked inverter circuit 312 and the data bus D-BUS. Specifically, when an area 91 is an target of data line repair, although not limited, the address shifter 85 makes a clocked inverter corresponding to the data line repair target unselected and makes a clocked inverter existing on the right side of the clocked inverter selected in accordance with repair information which is set in the repair information setting circuit 240*b*. Since the clocked inverter corresponding to the data line repair target is unselected, the selected data is shifted one pixel by one pixel, and the clocked inverter corresponding to the data line repair area is selected, thereby repairing the data line. As shown in FIG. 16, data is time-division-transferred via the data bus D-BUS.

Figure 17:
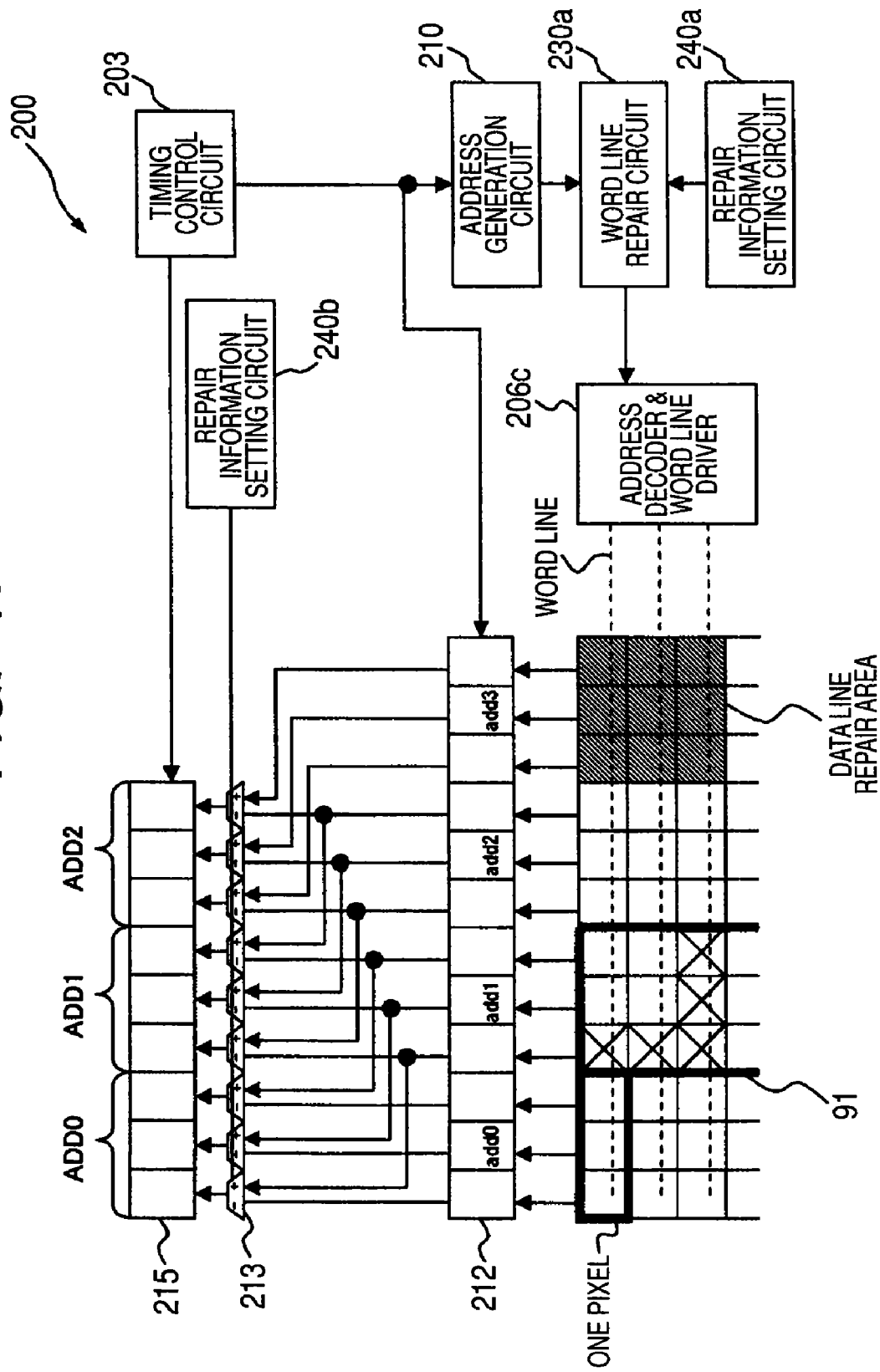
FIG. 17 is a block diagram showing another configuration example of the main part in the liquid crystal controller driver.

FIG. 17 shows another configuration example of the main part in the liquid crystal controller driver 200.

The liquid crystal controller driver 200 shown in FIG. 17 is largely different from that shown in FIG. 2 with respect to the point that selection data is shifted by the selector circuit 213 on the basis of repair information which is set in the repair information setting circuit 240*b*. Each of selectors in the selector circuit 213 selectively transmits output data of a clocked inverter corresponding to the selector and output data of a clocked inverter adjacent to the clocked inverter to the logic circuit 215. In the case where the area 91 is the target of data line repair, and the data line repair is performed, an output of a clocked inverter corresponding to the area 91 (corresponding to the transfer address add1) is made unselected by the selector 213. By shifting selection data one pixel by one pixel, data line repair is performed. In such a configuration, irrespective of the data line to be repaired, the length of the data transmission path from the clocked inverter 212 to the logic circuit 215 is almost equal. It is therefore unnecessary to consider variations in delay time on the data transmission path.

The present invention achieved by the inventors herein has been described concretely. Obviously, the invention is not limited to the above and can be variously changed.

The case of applying the present invention achieved by the inventors herein to the liquid crystal controller driver for generating and outputting a drive signal for a liquid crystal panel in the field of utilization as the background of the invention has been described. The invention is not limited to the case but can be also used for a semiconductor integrated circuit device for a display controller, for driving a display other than the liquid crystal, such as an organic EL display panel.

What is claimed is:

1. A semiconductor integrated circuit device for a display controller, comprising:

a display memory having a storage area and configured to store display data for a display device into the storage area;

a spare storage area provided outside of a regular storage area for storing the display data;

a repair circuit configured to repair a defect by replacing an area including a defect in the display memory with the spare storage area in accordance with repair information set in a repair information circuit;

a clocked inverter circuit including a plurality of clocked inverters corresponding to data output terminals of the display memory;

a logic circuit for receiving data transmitted from the clocked inverter circuit;

a data bus for transmitting output data from the clocked inverter circuit to the logic circuit; and a control circuit to transfer display data from the clocked inverter circuit to the logic circuit in a time division manner, wherein the control circuit controls the logic circuit in a time division manner, and controls the clocked inverter circuit via the repair circuit in a time division manner, wherein transfer addresses are assigned to the plurality of clocked inverters of said clocked inverter circuit, each said transfer address comprising a plurality of groups, each said group corresponding to one pixel, wherein the logic circuit includes a plurality of logic subcircuits, and the transfer addresses are assigned to the plurality of logic subcircuits as a plurality of said groups, and wherein one pixel includes a first bit, a second bit, and a third bit.

2. The semiconductor integrated circuit device for a display controller according to claim 1,
wherein when a positive integer excluding 0 is set as "n", an un-used address is assured by dividing the display memory into a plurality of storage areas each smaller than an address space of the n-th power of 2, and the un-used address is assigned to the clocked inverter circuit corresponding to the spare storage area, thereby performing address control for making the clocked inverter circuit corresponding to the spare storage area shift to a data output state in place of the clocked inverter circuit corresponding to the area including the defect in the display memory.

3. The semiconductor integrated circuit device for a display controller according to claim 2,
wherein the data bus is shared by a plurality of mats formed by dividing the display memory into storage areas each smaller than an address space of the n-th power of 2.

4. The semiconductor integrated circuit device for a display controller according to claim 3, further comprising:
an internal address conversion circuit configured to convert an address signal supplied from outside of the semiconductor integrated circuit device into an internal address signal and a mat selection signal,
wherein a mat is selected by the mat selection signal, and address control for making the clocked inverter circuit corresponding to the spare storage area shift to a data output state is performed by using the internal address signal.

* * * * *